United States Patent [19]

Schomers et al.

[11] Patent Number: 4,679,121
[45] Date of Patent: Jul. 7, 1987

[54] ASSEMBLY SYSTEM FOR COMMUNICATIONS DEVICE HAVING PLUG-IN CIRCUIT BOARDS CONNECTED IN MULTIPLE STAGES

[75] Inventors: Josef Schomers, Backnang; Kurt Erbele, Weissach; Wernfried Bonk, Auenwald, all of Fed. Rep. of Germany

[73] Assignee: ANT Nachrichtentechnik GmbH, Backnang, Fed. Rep. of Germany

[21] Appl. No.: 864,418

[22] Filed: Jan. 24, 1986

[30] Foreign Application Priority Data

Jan. 24, 1985 [DE] Fed. Rep. of Germany ....... 3502295

[51] Int. Cl.⁴ ............................................. H05K 1/14
[52] U.S. Cl. ................................... 361/413; 361/393; 361/395; 361/415; 361/416
[58] Field of Search ............... 361/393, 394, 395, 413, 361/415, 416

[56] References Cited

U.S. PATENT DOCUMENTS

| | | | |
|---|---|---|---|
| 3,179,904 | 4/1965 | Paulsen | 174/36 X |
| 3,539,873 | 11/1970 | Rosenberg et al. | 361/416 |
| 3,623,127 | 11/1971 | Glenn | 361/415 X |
| 3,715,629 | 2/1973 | Swengel | 361/416 X |
| 4,420,793 | 12/1983 | Strandberg | 361/415 X |

FOREIGN PATENT DOCUMENTS

| | | | |
|---|---|---|---|
| 0037882 | 8/1984 | European Pat. Off. | 361/416 |
| 7215350 | 7/1972 | Fed. Rep. of Germany | 339/17 M |
| 73623 | 9/1960 | France | 361/415 |
| 806835 | 12/1958 | United Kingdom | 361/413 |

OTHER PUBLICATIONS

Photoprints Corp., Multilayer Printed Circuits, Tech. Bull. P-11, 2 pages.
Willy Bohnenberger et al, "Intermas, das mechanishce Aufbausystem", 1972, Techn. Mitt. AEG-Telefunken, pp. 148-162.

Primary Examiner—R. R. Kucia
Attorney, Agent, or Firm—Spencer & Frank

[57] ABSTRACT

An electrical device assembly system composed of plug-in circuit boards each having a plurality of plug-in connectors at an edge presenting input and output terminals. Magazines each mounting a plurality of the circuit boards are provided. The magazines each have a rear side and are disposed adjacent to one another. Each plurality of plug-in circuit boards are mounted in a respective one of the magazines so that the plug-in connectors are located at the rear side. Rear wall circuit boards are fastened to the rear sides of the magazines and include plug-in counterconnectors for mating with corresponding ones of the plug-in connectors at the edges of the plug-in circuit boards. The plug-in connectors of each plurality of plug-in circuit boards define separate regions at the rear side of each magazine. At least one rear wall circuit board is fastened to two adjacent magazines and covers two adjacent ones of the regions, one each from the two adjacent magazines. The plug-in counterconnectors each have a plurality of electrical contacts corresponding to the input and output terminals, respectively, of the plug-in connectors. The rear wall circuit board includes conductor paths between selected contacts for forming the electrical connections between the input and output terminals. Respective ones of the input and output terminals of each plug-in circuit board are associated with the connector of the plurality of connectors which is closest to the adjacent magazine to which the respective ones of the input and output terminals are connected.

3 Claims, 7 Drawing Figures

ASSEMBLY SYSTEM FOR COMMUNICATIONS DEVICE HAVING PLUG-IN CIRCUIT BOARDS CONNECTED IN MULTIPLE STAGES

BACKGROUND OF THE INVENTION

The present invention relates to an assembly system for mounting and interconnecting plug-in circuit boards (also referred to as plug-in modules) as used in electrical communications devices. Such an assembly system is disclosed in German Utility Model Pat. No. 72/5,350. It is composed of plug-in modules carrying electrical components and, along one edge, multipoint connectors. A plurality of plug-in modules are inserted into the front side of a magazine equipped at its rear side with a rear wall circuit board. This circuit board accommodates female multipoint connectors with which the multipoint connectors of the plug-in modules mate. The female multipoint connectors are electrically interconnected by means of conductor paths on the rear wall circuit board.

Larger communications devices are composed of a plurality of such magazines which are electrically interconnected by means of cable harnesses. These cable harnesses are produced by high-cost manual labor in which errors may occur. Due to this manual labor, the positions of the individual wires in the cable harnesses differ from item to item. The result is that the electrical properties, particularly the crosstalk attenuation between two wires or pairs of wires is likewise different and not predictable from item to item. This limits the use of cable harnesses when communications signals at higher frequencies are involved.

In many devices, a very large number of connections are required between the individual magazines, with these connections originating in one magazine in a certain sequence but ending in another magazine in a completely different sequence.

FIG. 1 illustrates a general plan view of a three-stage switching matrix for a communications exchange system. Each stage is composed of 16 submatrixes. If the above-described assembly system is used to realize such a switching matrix, the submatrixes will be configured as plug-in modules and will be accommodated in magazines arranged according to stages. In the example of FIG. 1, there result 16 plug-in modules G1 to G16 per stage (magazine), each module containing one submatrix. Each submatrix is composed of 256 switching points KP.

The respective 16 submatrixes, i.e. the 16 plug-in modules G1 to G16 of each stage, are accommodated in a separate magazine; the submatrixes of the first stage in a first magazine M1, those of the second stage in a second magazine M2 and those of the third stage in a third magazine M3.

Each plug-in module has 16 input terminals E1 to E16 and 16 output terminals A1 to A16. Since these input and output terminals likewise are all brought out of their respective magazines, each magazine, i.e. each stage, has 256 input terminals and 256 output terminals. The 256 input terminals of the first stage are connected with 256 data sources (not shown) and the 256 output terminals of the third stage are connected with 256 data sinks (not shown). According to the scheme shown in Table 1 below, the 256 output terminals of the first stage are connected with the 256 input terminals of the second stage and the 256 output terminals of the second stage are connected with the 256 input terminals of the third stage.

| First and second stage | | Second and third stage | |
|---|---|---|---|
| plug-in module | output terminals | plug-in module | input terminals |
| G1 | A1 | G1 | E1 |
|  | A2 | G2 | E1 |
|  | . | . | . |
|  | . | . | . |
|  | . | . | . |
|  | A16 | G16 | E1 |
| G2 | A1 | G1 | E2 |
|  | A2 | G2 | E2 |
|  | . | . | . |
|  | . | . | . |
|  | A16 | G16 | E2 |
| etc. |  |  | etc. |
| to |  |  | to |
| G16 | A1 | G1 | E16 |
|  | A2 | G2 | E16 |
|  | . | . | . |
|  | . | . | . |
|  | A16 | G16 | E16 |

Heretofore the connections between stages would be accomplished by manually assembled wiring harnesses, resulting in the problems previously described.

SUMMARY OF THE INVENTION

It is an object of the present invention to further develop an assembly system for devices used in the electrical communications art of the foregoing type so that the following requirements are met:

(a) mechanical parts, such as magazines, plug-in modules, male and female connector strips as available in the trade should be usable, for example, those used in the Intermas Assembly System described in the German periodical "Technische Mitteilungen AEG-TELEFUNKEN" [Technical Reports from AEG-TELEFUNKEN] Vol. 62 (1972), No. 4/5, pages 148–162, wherein plug-in modules (there called modules or plug-in circuit boards) can be assembled from standard parts and can be inserted into likewise standard magazines (there called full inserts).

(b) the electrical connections between two adjacent magazines should be such that the following conditions are met:

(b2) they are suitable for a plurality of individual connections;

(b3) the connections can originate and end in the magazines in different sequences (not only the scheme of Table 1, but any other desired scheme should be realizable);

(b4) small differences in electrical characteristics occur between individual units.

The above and other objects are accomplished in the context of an assembly system for an electrical device composed of plug-in circuit boards each having an edge and being provided with a plurality of plug-in connectors at such edge, the plug-in connectors presenting input and output terminals; a plurality of magazines each mounting a plurality of the plug-in circuit boards, the magazines each having a rear side and being disposed adjacent to one another, each plurality of plug-in circuit boards being mounted in a respective one of the magazines so that the plug-in connectors are located at the rear side of the magazine; and rear wall circuit boards fastened to the rear sides of the magazines and including plug-in counterconnectors for mating with corresponding ones of the plug-in connectors at the edges of the plug-on circuit boards, wherein electrical connections are formed between input and output terminals of plug-in circuit boards located in adjacent magazines, wherein according to the invention: the plug-in connectors of each plurality of plug-in circuit boards define separate regions at the rear side of each said magazine, and at least one rear wall circuit board is fastened to two adjacent magazines and covers two adjacent ones of said regions, one each from the two adjacent magazines; the plug-in counterconnectors each have a plurality of electrical contacts corresponding to the input and output terminals, respectively, of the plug-in connectors, and the rear wall circuit board includes conductor paths between selected contacts for forming the electrical connections between the input and output terminals; and respective ones of the input and output terminals of each plug-in circuit are associated with the connector of the plurality of connectors which is closest to the adjacent magazine to which the respective ones of the input and output terminals are connected.

According to a further feature of the invention the assembly system is usable for the transmission of data signals at a bit rate up to 150 Mbit/s even CMI-coded.

It is noted that a three-stage switching matrix is disclosed in European Pat. No. 0,037,882. It requires circuit boards whose frontal faces abut against one another when rotated about 90°. That patent, however, does not give any teaching as to how the circuit boards are mounted or whether or not they are accommodated in a magazine. A special construction appears to be required. Moreover, the connections between individual stages cannot be made at will. Thus, with this prior art multistage switching matrix, objects (a) and (b3) of the present invention cannot be realized.

BRIEF DESCRIPTION OF THE INVENTION

Figure 4:
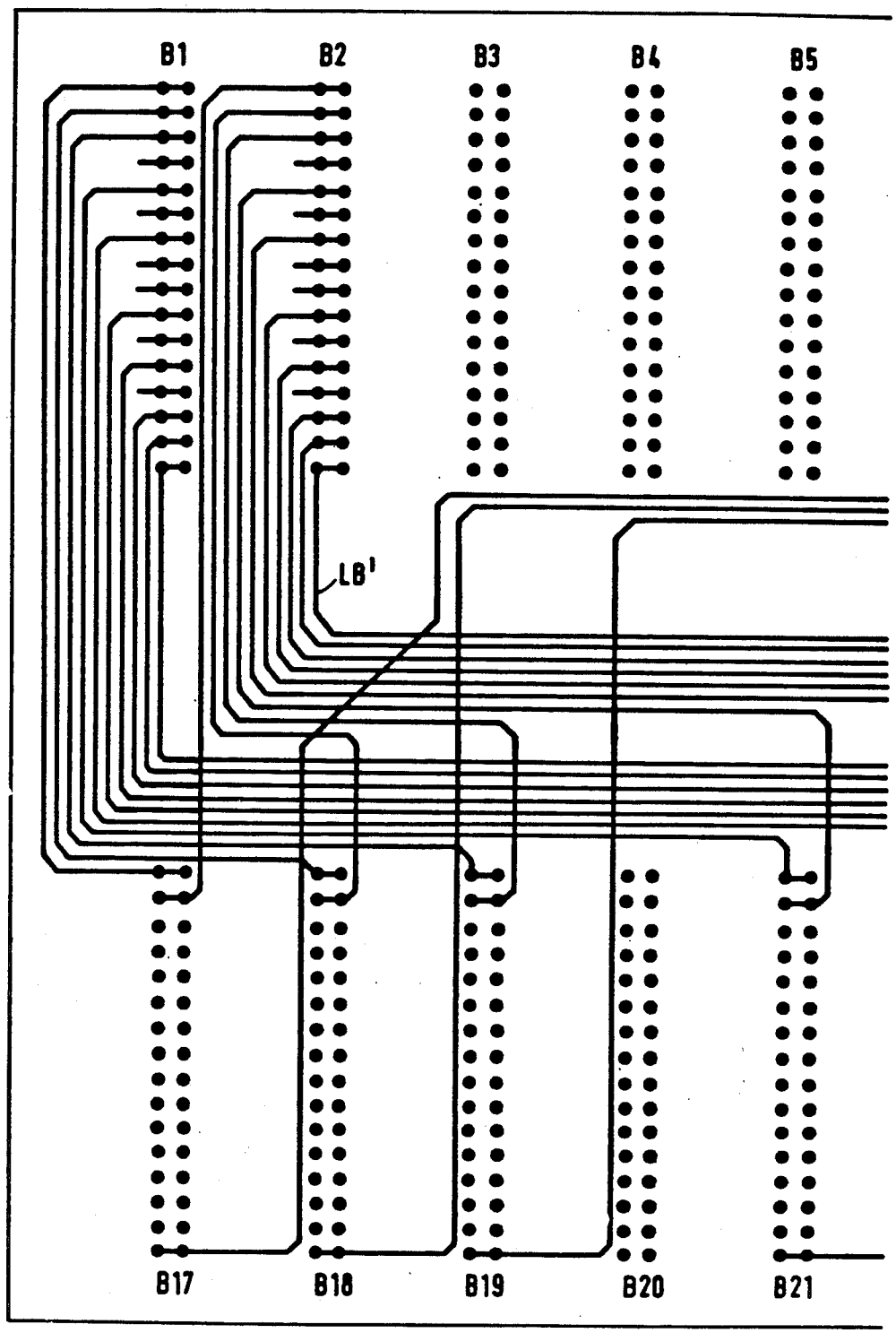
Figure 5:
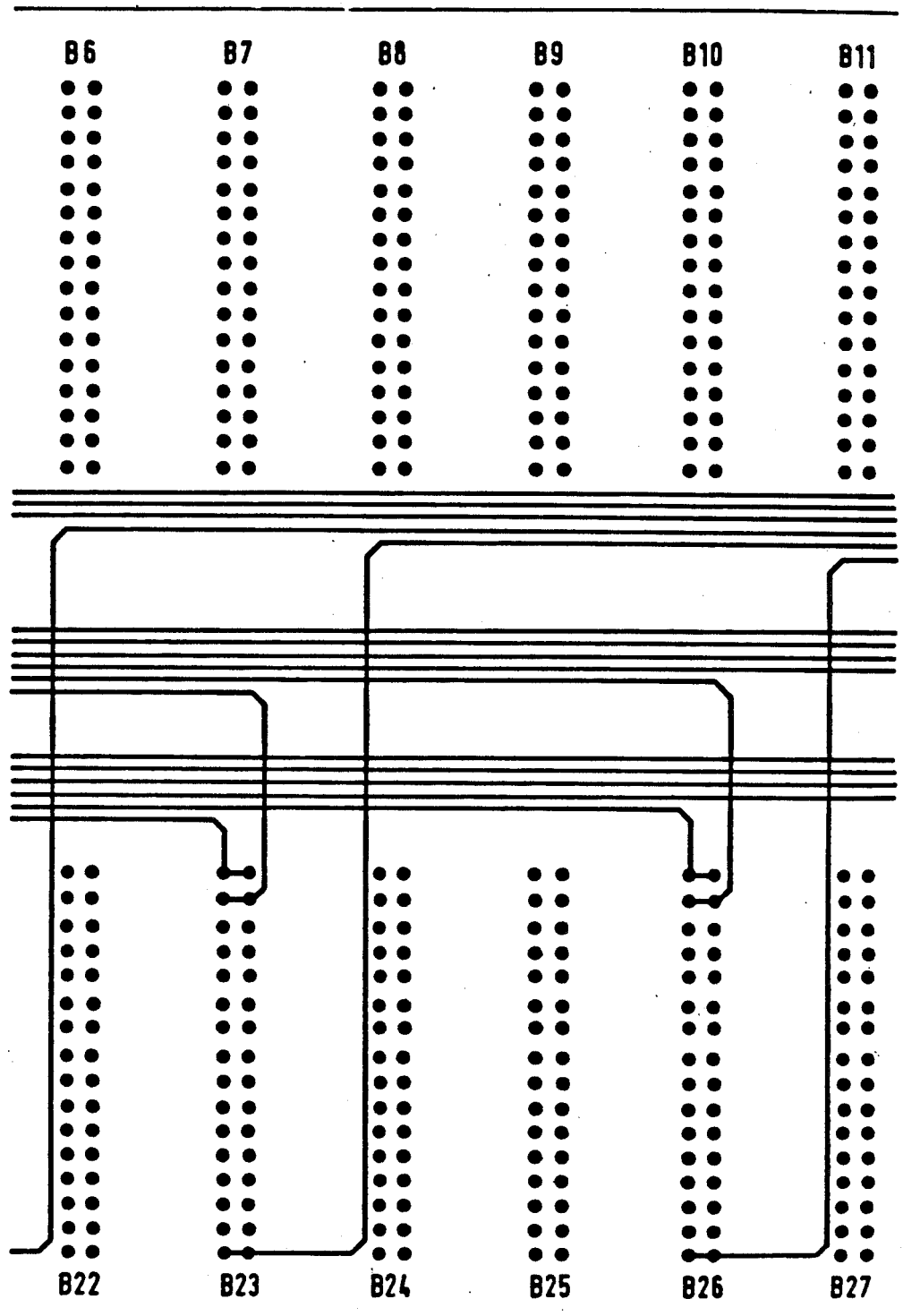
Figure 6:
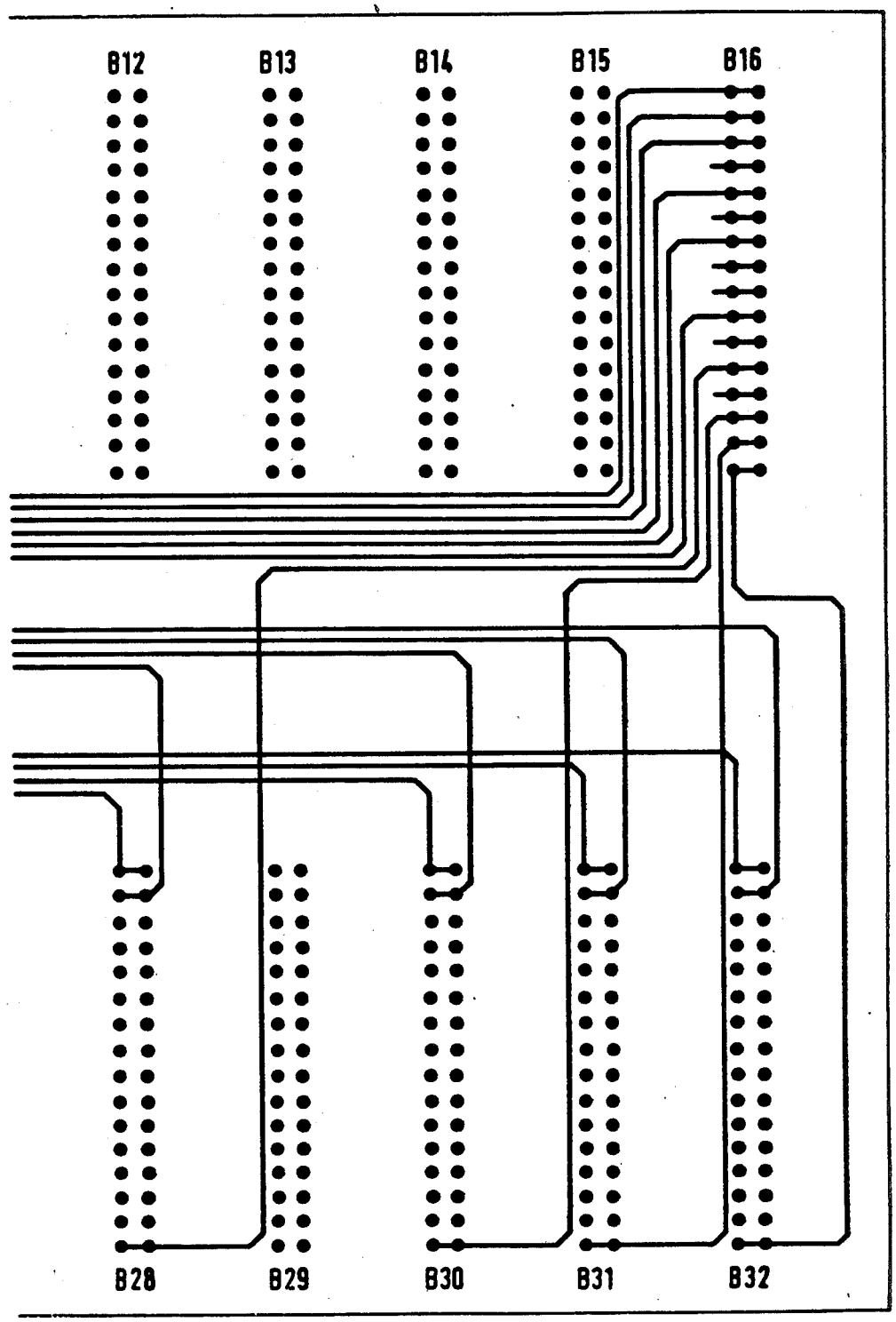

FIGS. 4 to 6 together comprise a schematic of a rear wall circuit board embodying features of the invention.

Figure 7:
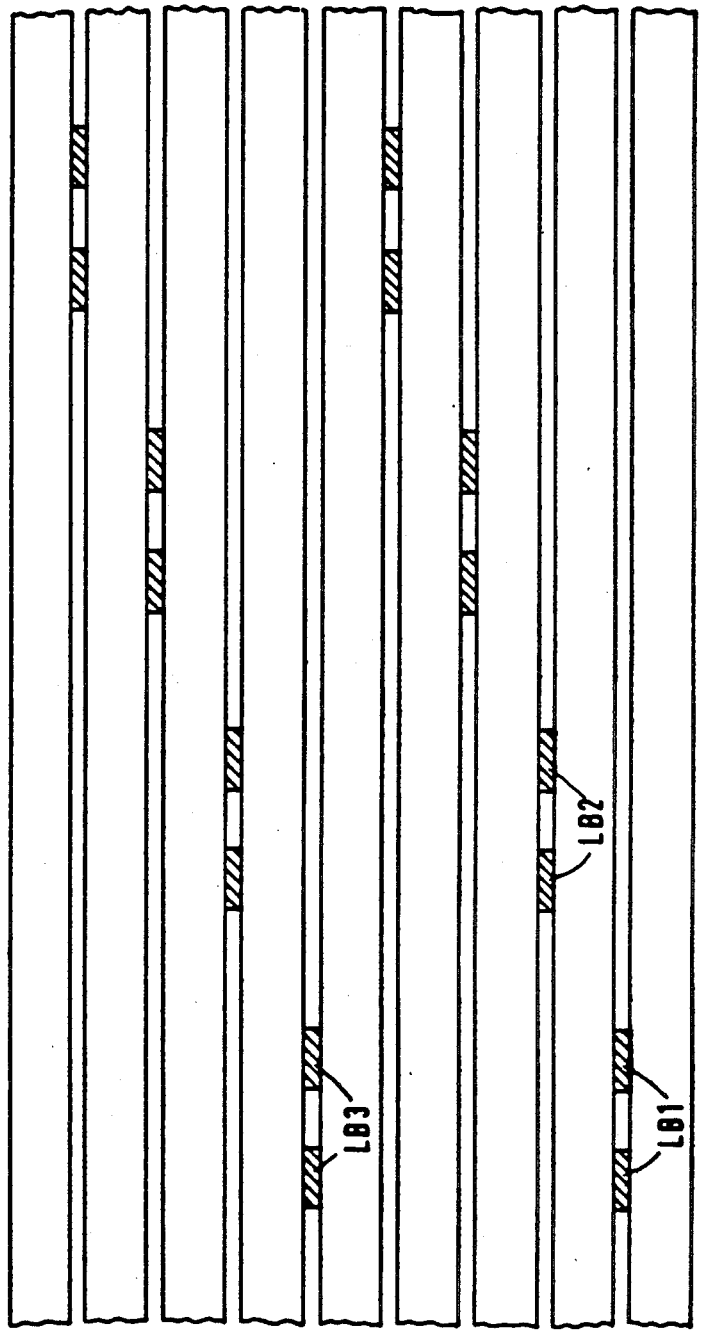

FIG. 7 is a schematic of a cross section of a rear wall circuit board illustrating further features of the invention.

DESCRIPTION OF THE PREFERRED EMBODIMENTS

Figure 1:
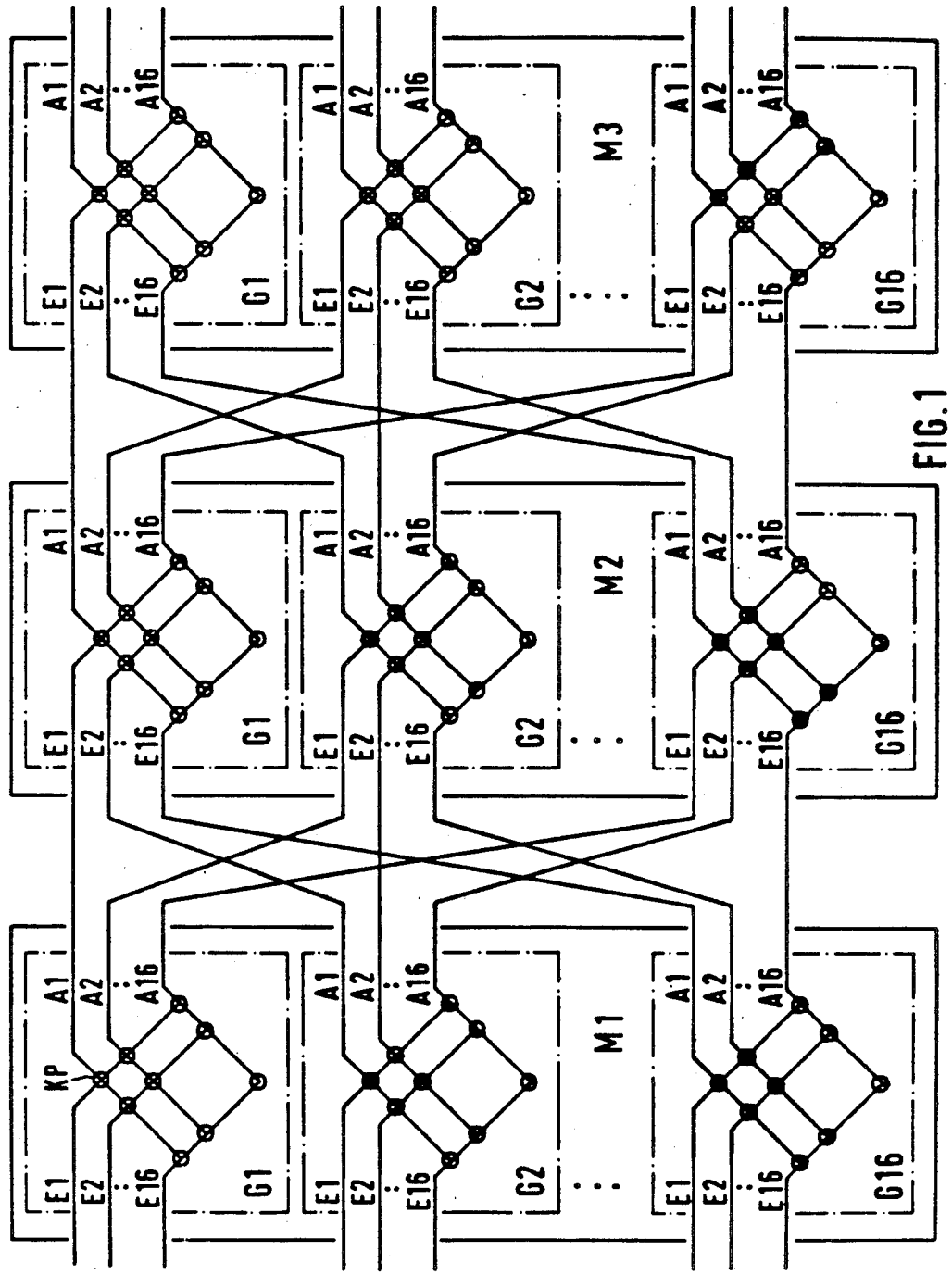
FIG. 1 is a schematic showing a plan view of a known three-stage switching matrix for a communications exchange system.

The present invention will now be described with reference to an embodiment shown in FIGS. 2 to 7. This embodiment shows how the coupling matrix shown in FIG. 1 can be assembled advantageously with the assembly system according to the present invention.

FIG. 2 again shows the three magazines M1 to M3, here in a mechanical arrangement on top of one another. The first magazine M1 is at the top, below it is the second magazine M2 and the third magazine M3 is disposed at the far bottom. In a manner not shown, they are mechanically interconnected. The second magazine is thus adjacent the first magazine as well as adjacent the third magazine.

Each magazine has 16 guide strips F at its top and at its bottom, into which the plug-in modules are guided. Only the lower guide strips are visible. Of the 48 plug-in modules (16 per magazine), only the sixteenth plug-in module G16 of the third magazine M3 is shown. Each plug-in module has a first male connector strip S1 and a second male connector strip S2 as its plug-in connectors, wherein each male connector strip has a plurality of male connector terminals constructed in a conventional manner.

Additionally shown is a first rear wall circuit board L1 and a second rear wall circuit board L2. Each rear wall circuit board is provided with two rows of a plurality of female connector strips, each female connector strip having 16 conventional female connectors in the form of sockets, with the female connector strips B1 to B16 forming the upper row and female connector strips B17 to B32 forming the lower row. The first 11 female connector strips in the lower row, i.e. B17-B27 are not visible in FIG. 2. Also provided is a third rear wall circuit board L3 and a fourth rear wall circuit board L4. These are each equipped with only one row of 16 female connector strips.

Figure 2:
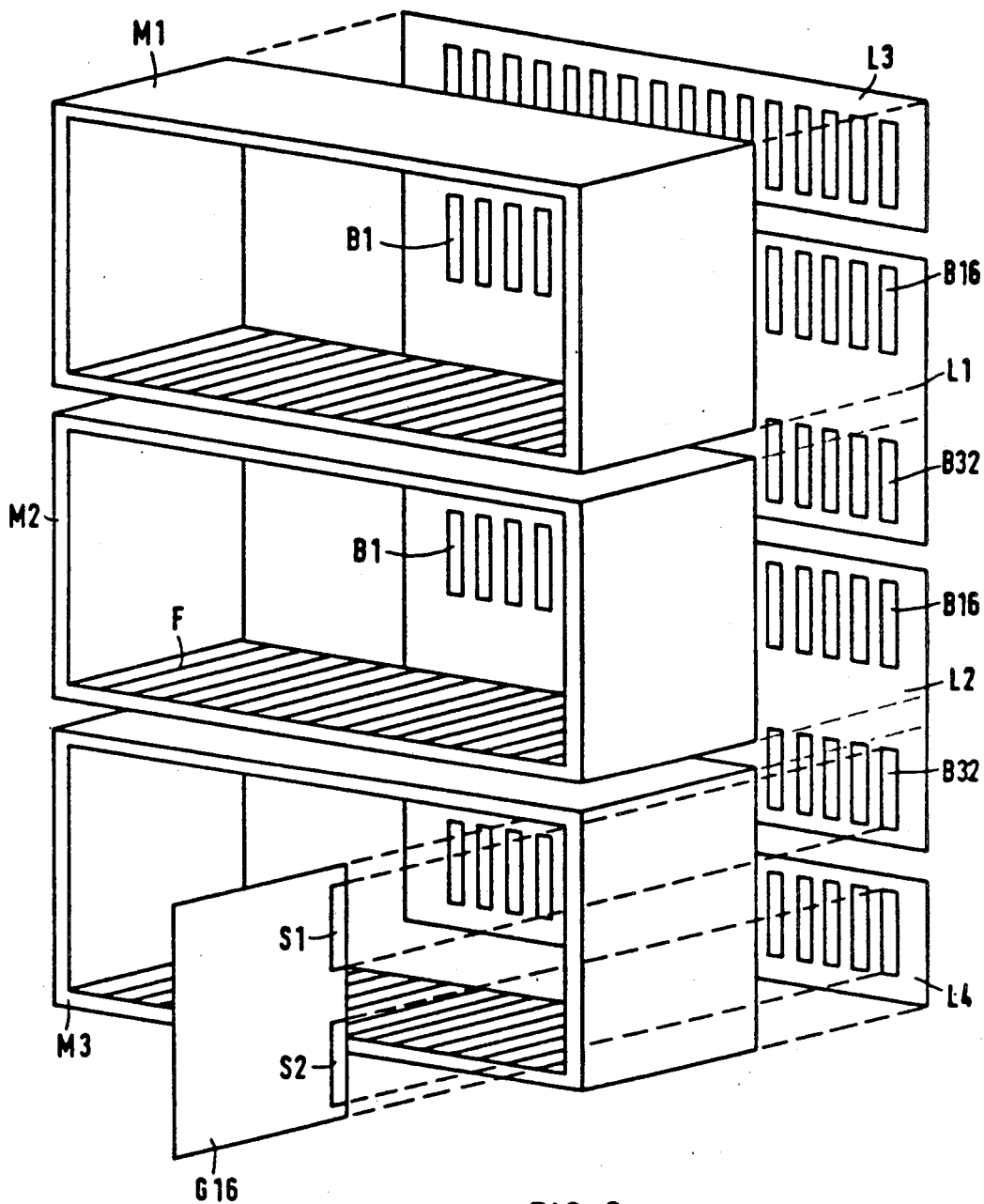
FIG. 2 is a schematic showing a perspective view of an assembly system embodying features of the invention.

The dashed lines in FIG. 2 indicate (1) the pair of guide strips F into which the illustrated plug-in module G16 is brought into contact when inserted; (2) the position that the rear wall circuit boards take up after assembly at the rear of the magazines; and (3) that connector strips S1 and S2 of the illustrated plug-in module G16 mate with female connector strip B32 of the second rear wall circuit board L2 and with a connector strip of the fourth rear wall circuit board L4 which does not have a reference numeral. In a similar manner, male connector strips S1 and S2 of the non-illustrated plug-in modules mate with their associated female connector strips. The association of elements shown in FIG. 2 can be diagrammed as shown in Table 2 below:

| Magazines containing plug-in modules G1 to G16 | male connector strips | rear wall circuit board | female connector strips |
|---|---|---|---|
| M1 | S1 | L3 | |
|  | S2 | L1 | B1 to B16 |
| M2 | S1 |  | B17 to B32 |
|  | S2 | L2 | B1 to B16 |
| M3 | S1 |  | B17 to B32 |
|  | S2 | L4 | |

Rear wall circuit board L1 thus covers the region of male connector strips S2 of the first magazine M1 and the region of male connector strips S1 of the second magazine M2. The region of male connector strips S2 of the first magazine M1 is adjacent the region of male connector strips S1 of the second magazine M2. The associations for rear wall circuit board L2 are similar.

Figure 3:
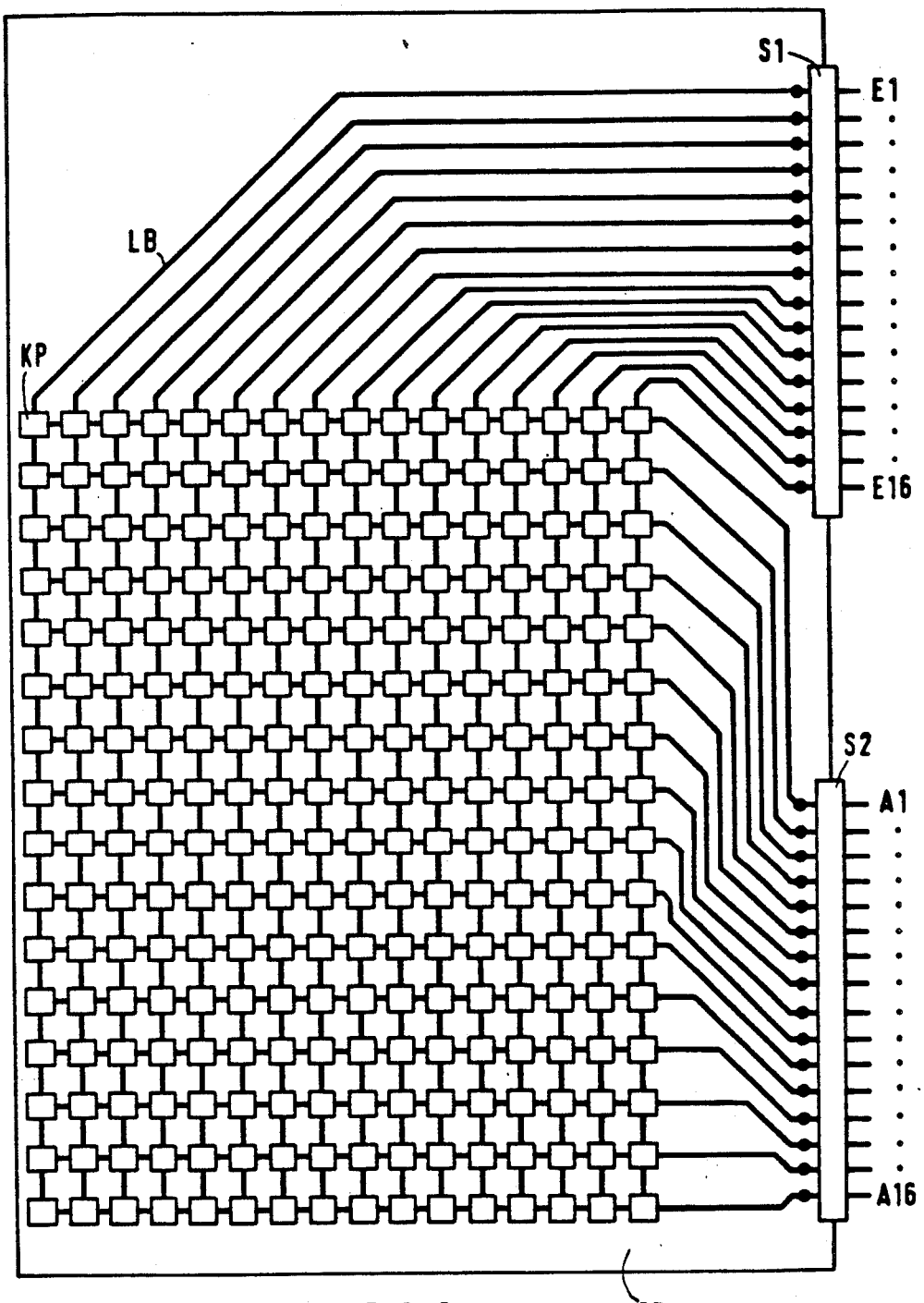
FIG. 3 is a schematic of a plug-in circuit board usable in an assembly system according to the invention.

FIG. 3 shows one of plug-in modules G1 to G16. It is composed of a conventional circuit board LP accommodating a submatrix in the form of 256 switching points KP which are arranged in a 16×16 matrix, a first male connector strip S1 and a second male connector strip S2. Circuit board LP is provided with conductive paths LB which connect switching points KP with one another and also with the 16 input terminals E1 to E16 and with 16 output terminals A1 to A16 of the submatrix connector strips S1 and S2, respectively. Input terminals E1 to E16 all come out of the first male connector strip S1, output terminals A1 to A16 all come out of the second male connector strip S2. As can be seen in FIG. 2, in the plug-in modules of the second magazine M2, the first connector strip S1 is closest to the first magazine M1. Therefore, input terminals E1 to E16 are brought out there, since they must be connected, according to FIG. 1, with the output terminals A1 to A16 of the first magazine M1. The same applies in a similar sense for the second male connector strip S2 and for the plug-in modules of the other magazines.

Conductor paths LB are here shown to comprise a single line. Since, however, switching matrixes usually are designed to have two or even four conductors, it must be imagined that instead of one line there are two or four conductor paths for each line and the corresponding number of male terminals, or pins, are on the male connector strips.

FIGS. 4, 5 and 6 together show one of rear wall circuit boards L1 and L2. These drawing figures should be considered while placed next to one another, with FIG. 5 in the middle, FIG. 4 on the left and FIG. 6 on the right. The upper and lower lines in these Figures, as well as the left and right lines in FIGS. 4 and 6, respectively, identify the outlines of the illustrated rear wall circuit board. The upper and lower columns of dots identify the locations for the upper (B1 to B16) and lower (B17 to B32) rows of female connector strips, respectively. The female connector strips themselves are not shown, only the solder eyes for their soldered pins are indicated by dots. If one considers the first rear wall circuit board L1, FIGS. 2 and 3 show that the output terminals A1 to A16 of connector strips S2 of plug-in modules G1 to G16 of the first magazine M1 lie on female connector strips B1 to B16. Input terminals E1 to E16 of connector strips S1 of the plug-in modules of the second magazine M2 lie on female connector strips B17 to B32, beginning at the top of each connector strip S1 and S2 with E1 and A1, respectively.

The connections to be produced according to Table 1 are formed by conductor paths LB'. A single line illustration has again been selected and one must imagine two conductor paths instead of the single line since, as can be seen by the illustration of two solder eyes for each input and output, respectively, the drawing represents a rear wall circuit board for a two-conductor switching matrix. Of the many connections that have to be made according to Table 1, only a few connections are shown here. It is also not shown that the conductor paths are distributed in different planes of a multilayer board so as to accommodate their large number and to provide proper crossings for them.

To avoid points of impact, which are annoying particularly in connection with higher frequency communications signals, no acute angle bends in the conductor paths are made and rectangular bends are opened up to form obtuse angle bends. Instead of the obtuse angle bends it is also possible to provide a rounded design. This also applies for the conductor paths of the plug-in modules. If acute angle bends cannot be avoided, they may likewise be opened up into a plurality of obtuse angle bends or may be rounded.

In this embodiment, the second rear wall circuit board L2 is the same as the first rear wall circuit board L1 since, according to Table 1, the scheme for the connections between the first and second stage is identical to that for the connections between the second and third stages. However, different schemes may also be realized; it is then only necessary to provide different rear wall circuit boards with appropriately configured conductor paths.

By using the circuit board technique in the form of the rear wall circuit boards according to the present invention, the thus produced connections have electrical properties (e.g. crosstalk attenuation) which differ little from one system to the other and thus the connections are also suitable for the transmission of higher frequency communications signals. The possibility of manufacturing such circuit boards by machine also excludes flaws due to human error.

An illustration of the third and fourth rear wall circuit boards L3 and L4 in a separate drawing figure is not necessary since they serve to produce, in the conventional manner, the connections from the signal sources to the inputs of the first stage and from the outputs of the third stage to the data sinks. Also not shown are switching means and control lines for switching through and disconnecting the switching points. This also applies for the plug-in modules.

FIG. 7 is a sectional view of a multilayer board and shows the positions of the conductor paths therein. The board has nine layers between which lie the conductor paths, shown by hatching. It is assumed that a two-conductor switching matrix exists, i.e. each connection involves a pair of conductor paths. The first pair is marked LB1 and lies in the first plane between the first and second layer. To be able to realize sufficiently high crosstalk attenuation even for higher frequency communication signals, the second pair LB2 in the next plane, is not disposed immediately adjacent the first pair LB1, but instead is laterally offset by a distance corresponding to the required crosstalk attenuation. This offset extends over four planes. The given crosstalk attenuation requirements do not permit the placement of a pair of conductor paths LB3 without any offset with respect to the first pair LB1 until the fifth plane.

The assembly system according to the present invention is particularly well suited for the assembly of broadband switching matrixes in broadband communications systems in which, inter alia, digitalized television signals are transmitted at high bit rates, and the features disclosed herein make the invention suitable for communications systems operating with bit rates of 140 Mbit/s even CMI-coded.

The assembly system according to the present invention not only permits the construction of multistage switching matrixes, but also other electrical devices composed of a plurality of stages in which plug-in modules are arranged in stages and accommodated in the proper sequence in magazines and wherein many electrical connections are required between adjacent magazines.

The plug-in modules and magazines of the assembly system according to the present invention may be manufactured of standard parts available in the trade and used, for example, in the Intermas Assembly System to which reference has been previously made, so that no special constructions are required. Th manufacture of the rear wall circuit boards according to the invention does not produce any new special problems, because these circuit boards are no larger than those customary in the Intermas Assembly System.

A preferred embodiment of the multilayer board comprises nineteen layers. Thus, there are eighteen planes between these layers. The first to eighth and the eleventh to eigtheenth planes comprise the conductor paths according to table 1 and shown in the FIGS. 4 to 6. The ninth and tenth plane comprises conductor paths to embody the control lines not shown in the FIGS. 4 to 6. The lateral offset between adjacent pairs of conductor paths to realize the required crosstalk attenuation extends over eight planes.

The layers are made of a material of the type GFN according to MIL P-13949F. The thickness of a layer is 0.15 mm. The thickness of a conductor path is 0.017 mm. The width of a conductor path is 0.2 mm. The width of the gap between the conductor paths of a pair is 0.2 mm. The size of the offset between conductor paths of adjacent planes is 1.2 mm, measured between the middles of the concerning pairs. The crosstalk attenuation achieved by the above described provisions is not less than 43 dB between the pairs of adjacent planes and not less than 47 dB between that pairs of planes without offset, as for example between the pairs of the first and eleventh plane or the second and twelfth plane and so on.

The above described embodiment of a multilayer board is suitable to transmit NRZ-signals with a bit rate up to 300 Mbit/s.

It will be understood that the above description of the present invention is susceptible to various modifications, changes and adaptations, and the same are intended to be comprehended within the meaning and range of equivalents of the appended claims.

What is claimed is:

1. In an assembly system for an electrical device composed of plug-in circuit boards each having an edge and being provided with a plurality of plug-in connectors at such edge, the plug-in connectors presenting input and output terminals; a plurality of magazines each mounting a plurality of the plug-in circuit boards, the magazines each having a rear side and being disposed adjacent to one another, each plurality of plug-in circuit boards being mounted in a respective one of the magazines so that the plug-in connectors are located at the rear side; and rear wall circuit boards fastened to the rear sides of the magazines and including plug-in counterconnectors for mating with corresponding ones of the plug-in connectors at the edges of the plug-in circuit boards, wherein electrical connections are formed between input and output terminals of plug-in circuit boards located in adjacent magazines, the improvement wherein:

the plug-in connectors of each said plurality of plug-in circuit boards define separate regions at the rear side of each said magazine, and at least one rear wall circuit board is fastened to two adjacent magazines and covers only two adjacent ones of said regions, one each from said two adjacent magazines; said plug-in counterconnectors each have a plurality of electrical contacts corresponding to said input and output terminals, respectively, of said plug-in connectors, and said rear wall circuit board includes conductor paths between selected contacts for forming the electrical connections between said input and output terminals; and respective ones of said input and output terminals of each said plug-in circuit board are associated with the connector of said plurality of connectors which is closest to the adjacent magazine to which the respective ones of said input and output terminals are connected.

2. Assembly system according to claim 1, wherein said at least one rear wall circuit board has multiple layers defining multiple planes between said layers, said conductor paths extend in parallel in various ones of said planes, offset with respect to one another, the width of the offset and the number of said planes being determined in accordance with a predetermined crosstalk attenuation value to be maintained between said conductor paths, and wherein any acute angle bend and right angle bend in said conductor paths is either rounded or is formed by a plurality of obtuse angle bends.

3. Assembly system according to claim 2, wherein said conductor paths each comprise parallel pairs of conductor paths.

* * * * *